US012085976B2

(12) United States Patent
Liang et al.

(10) Patent No.: US 12,085,976 B2
(45) Date of Patent: Sep. 10, 2024

(54) SEMICONDUCTOR DIE, ELECTRONIC COMPONENT, ELECTRONIC APPARATUS AND MANUFACTURING METHOD THEREOF

(71) Applicant: Shanghai Biren Technology Co., Ltd, Shanghai (CN)

(72) Inventors: Yikai Liang, Shanghai (CN); Junhai Liu, Shanghai (CN); Wenqi Li, Shanghai (CN); Linglan Zhang, Shanghai (CN); Dongcai Li, Shanghai (CN); Zheng Tian, Shanghai (CN)

(73) Assignee: Shanghai Biren Technology Co., Ltd, Shanghai (CN)

( * ) Notice: Subject to any disclaimer, the term of this patent is extended or adjusted under 35 U.S.C. 154(b) by 220 days.

(21) Appl. No.: 17/838,283

(22) Filed: Jun. 13, 2022

(65) Prior Publication Data

US 2022/0404857 A1 Dec. 22, 2022

(30) Foreign Application Priority Data

Jun. 16, 2021 (CN) .......................... 202110663710.2

(51) Int. Cl.
*G06F 1/06* (2006.01)
*H03L 7/08* (2006.01)
(52) U.S. Cl.
CPC . *G06F 1/06* (2013.01); *H03L 7/08* (2013.01)
(58) Field of Classification Search
CPC ..................................... G06F 1/06; H03L 7/08
See application file for complete search history.

(56) References Cited

U.S. PATENT DOCUMENTS

| 7,248,890 | B1 * | 7/2007 | Raghavan | ............... H04L 25/14 |
| | | | | 455/226.1 |
| 9,543,937 | B2 * | 1/2017 | Fiedler | .................. H03L 7/0812 |
| 9,906,312 | B2 * | 2/2018 | Kim | ...................... H04B 10/803 |
| 10,498,567 | B1 * | 12/2019 | Kaviani | .............. H04L 25/4917 |
| 10,509,104 | B1 * | 12/2019 | Dato | ....................... G01S 13/87 |
| 2017/0103786 | A1 | 4/2017 | Lee | |

FOREIGN PATENT DOCUMENTS

| CN | 106206533 | 12/2016 |
| CN | 110830034 | 2/2020 |
| CN | 111221772 | 6/2020 |

OTHER PUBLICATIONS

"Office Action of Taiwan Counterpart Application", issued on Jan. 19, 2023, p. 1-p. 20.

\* cited by examiner

*Primary Examiner* — Brian T Misiura
(74) *Attorney, Agent, or Firm* — JCIP GLOBAL INC.

(57) ABSTRACT

A semiconductor die is provided. The semiconductor die includes a D2D transceiver composed of a single die or dual dies. The D2D transceiver includes a first D2D transmitter and a first D2D receiver. The D2D transmitter is configured to send data to a second D2D receiver in a second D2D transceiver of another semiconductor die using a first reference clock signal. The D2D receiver is configured to receive data from a second D2D transmitter in the second D2D transceiver using a second reference clock signal. Through using the embodiments of the disclosure, a transmission solution may be flexibly configured for a multi-application scenario including D2D.

13 Claims, 7 Drawing Sheets

410: Phase locked loop
510: Phase locked loop
420, 430, 520, 530: D2D transceiver

410: Phase locked loop
420, 430: D2D transceiver

FIG. 4

410: Phase locked loop
510: Phase locked loop
420, 430, 520, 530: D2D transceiver

SEMICONDUCTOR DIE, ELECTRONIC COMPONENT, ELECTRONIC APPARATUS AND MANUFACTURING METHOD THEREOF

CROSS-REFERENCE TO RELATED APPLICATION

This application claims the priority benefit of China application serial no. 202110663710.2, filed on Jun. 16, 2021. The entirety of the above-mentioned patent application is hereby incorporated by reference herein and made a part of this specification.

BACKGROUND

Technical Field

The disclosure relates to an electronic apparatus, and in particular to a semiconductor die for transmitting data, an electronic component, and a method for manufacturing the semiconductor die.

Description of Related Art

The large scale complex high performance system on chip (SoC), such as a general purpose graphics processing unit (GPGPU) die, an intelligent training and reasoning die, and an artificial intelligence (AI) die, needs to transmit large scale data at high speed. The transmission of the large scale data requires the SoC to have stronger computing capability and larger bandwidth. However, the manufacturing of large dies causes the issue of decreased manufacturing yield.

The planning and design of the reference clock structure of the high speed input/output (IO) interface of the semiconductor die is the key to implementing a high data transmission rate within a die and/or between dies. A reference clock may be provided for the clock of the entire die through an off-chip reference clock source and/or an on-chip reference clock source. A high quality reference clock signal is very important for the IO interface design of the SoC, especially for a high speed IO interface that has a very high jitter requirement of the clock signal, such as a high speed peripheral component interface express (PCIE) physical layer (PHY), a die to die (D2D) PHY, a high bandwidth memory (HBM) PHY, and a point to point (P2P) PHY implemented using the PCIE PHY.

Most reference clock designs of the high speed IO interface of the current SoC only support the basic requirements of a single scenario of a die PCIE or host, and cannot provide a D2D single application scenario, a multi-application scenario of the combination of the above application scenarios, and the planning and design of a backup reference clock, and the multi-application scenario cannot be flexibly configured.

SUMMARY

The disclosure provides a semiconductor die that provides a high performance reference clock signal to implement high speed data transmission within a die and/or between dies, and can meet a multi-application scenario requirement of a large scale high performance die and provide various planning and designs of a backup reference clock.

According to a first aspect of the disclosure, a semiconductor die is provided. The semiconductor die includes a first D2D transceiver. The D2D transceiver includes a first D2D transmitter and a first D2D receiver. The first D2D transmitter is configured to send data to a second D2D receiver in a second D2D transceiver of another semiconductor die using a first reference clock signal. The first D2D receiver is configured to receive data from a second D2D transmitter in the second D2D transceiver using a second reference clock signal.

In some embodiments, the semiconductor die further includes a first phase locked loop. The first phase locked loop is configured to receive an initial reference clock signal from outside the semiconductor die and to provide the first reference clock signal to the first D2D transmitter. The first D2D receiver is configured to receive the second reference clock signal from the first D2D transmitter or to receive the second reference clock signal from the second D2D transmitter. The second reference clock signal is the same as the first reference clock signal.

In some embodiments, the initial reference clock signal is a single end CMOS clock signal. The single end CMOS clock signal is converted into a differential CML clock signal via a phase locked loop.

In some embodiments, the semiconductor die further includes a third D2D transceiver. The third D2D transceiver includes a third D2D transmitter and a third D2D receiver. The third D2D transmitter is configured to send data to a fourth D2D receiver in a fourth D2D transceiver of another semiconductor die using the first reference clock signal, and the third D2D receiver is configured to receive data from a fourth D2D transmitter in the fourth D2D transceiver using the second reference clock signal.

In some embodiments, the first phase locked loop is further configured to provide the first reference clock signal to the third D2D transmitter. The third D2D receiver is configured to receive the second reference clock signal from the third D2D transmitter or the fourth D2D transmitter in the fourth D2D transceiver.

In some embodiments, the first D2D transmitter is configured to receive the first reference clock signal from outside the semiconductor die, and to send the first reference clock signal to the second D2D receiver; and the first D2D receiver is configured to receive the second reference clock signal from the second D2D transmitter.

In some embodiments, the semiconductor die further includes a third D2D transceiver. The third D2D transceiver includes a third D2D transmitter and a third D2D receiver. The third D2D transmitter is configured to receive the first reference clock signal from outside the semiconductor die, and to send data and the first reference clock signal to the fourth D2D receiver in the fourth D2D transceiver of another semiconductor die using the first reference clock signal. The third D2D transmitter is configured to receive the second clock signal from the fourth D2D transmitter in the fourth D2D transceiver, and to receive data from the fourth D2D transmitter in the fourth D2D transceiver using the second reference clock signal.

In some embodiments, the semiconductor die further includes a host link. The host link is configured to communicate with a host to transmit data. The host link includes a first host sub-link, a second host sub-link, a third host sub-link, and a fourth host sub-link. The first host sub-link is configured to transmit data using a third reference clock signal. The second host sub-link is configured to receive the third reference clock signal from the first host sub-link. The third host sub-link is configured to receive the third reference clock signal from the first host sub-link. The fourth host sub-link is configured to receive the third reference clock signal from the third host sub-link.

In some embodiments, the first host sub-link is further configured to receive the first reference clock signal from a second phase locked loop or a point to point (P2P) link or to receive the first reference clock signal from outside the semiconductor die.

In some embodiments, the P2P link further includes a second P2P sub-link. The second P2P sub-link is configured to establish a second communication channel with a second external electronic device to transmit data using a fourth reference clock signal received from the first P2P sub-link.

In some embodiments, the P2P link further includes a third P2P sub-link, a fourth P2P sub-link, a fifth P2P sub-link, and a sixth P2P sub-link. The third P2P sub-link is configured to establish a third communication channel with a third external electronic device to transmit data using the fourth reference clock signal received from the second P2P sub-link. The fourth P2P sub-link is configured to establish a fourth communication channel with a fourth external electronic device to transmit data using the fourth reference clock signal received from the second P2P sub-link. The fifth P2P sub-link is configured to establish a fifth communication channel with a fifth external electronic device to transmit data using the fourth reference clock signal received from the fourth P2P sub-link. The sixth P2P sub-link is configured to establish a sixth communication channel with a sixth external electronic device to transmit data using the fourth reference clock signal received from the fourth P2P sub-link.

According to a second aspect of the disclosure, an electronic component is provided, which includes a circuit board and a semiconductor die according to an embodiment of the disclosure. The semiconductor die is disposed on the circuit board.

According to a third aspect of the disclosure, an electronic apparatus is provided, which includes an electronic component according to an embodiment of the disclosure.

According to a fourth aspect of the disclosure, a method for manufacturing a semiconductor die is provided. The method includes providing a first die to die (D2D) transceiver. The first D2D transceiver includes a first D2D transmitter and a first D2D receiver. The first D2D transmitter is configured to send data to a second D2D receiver in a second D2D transceiver of another semiconductor die using a first reference clock signal. The first D2D receiver is configured to receive data from a second D2D transmitter in the second D2D transceiver using a second reference clock signal.

According to a fifth aspect of the disclosure, a D2D transceiver is provided, which includes a D2D transmitter and a D2D receiver. The D2D transmitter is configured to receive a reference clock signal, and to send a clock signal for transmitting data to the D2D receiver based on the reference clock signals from different clock signal sources according to different application scenarios (for example, an on-chip clock source or an off-chip clock source). The D2D transmitter is further configured to transmit data to the D2D receiver based on the received reference clock signal.

In an embodiment, the D2D transmitter includes a sending multiplexer, a sending phase locked loop, a retimer, a clock buffer, and multiple sending channels. The sending multiplexer is supplied with multiple reference clock signals to provide an appropriate reference clock signal to the sending phase locked loop according to different application scenarios. The sending phase locked loop is configured to generate a clock signal sent to the D2D receiver and for transmitting data to the D2D receiver based on the received reference clock signal according to different application scenarios. The sending channels are configured to transmit data to the D2D receiver based on the clock signal sent from the sending phase locked loop.

In an embodiment, the sending channels include multiple high speed transmission logic circuits, multiple sending flip-flops, and multiple output buffers. A sending high speed transmission logic circuit is configured to control logic and data transmission flow to be sent to the sending flip-flop. The sending flip-flop receives the clock signal from the sending phase locked loop and samples a high speed serial data stream based on a pulse rising edge or a pulse falling edge of the clock signal to be sent to the output buffer.

In an embodiment, the D2D receiver includes a receiving multiplexer, a receiving phase locked loop, and multiple receiving channels. The receiving multiplexer receives a high quality clock signal from the D2D receiver to be sent to the receiving phase locked loop. The receiving channel includes an input buffer, a phase interpolator, a receiving flip-flop, a receiving high speed transmission logic circuit, and a clock data restoring circuit.

In an embodiment, the input buffer is configured to receive data transmitted from the D2D transmitter to be sent to the receiving flip-flop. A data signal is sent to the clock data restoring circuit via the receiving flip-flop and the receiving high speed transmission logic circuit. The clock data restoring circuit is configured to execute data restoration to determine a phase of the data signal, that is, to determine a phase offset value, and to send the determined phase offset value to the phase interpolator. The phase interpolator sends a phase-accurate clock signal to the receiving flip-flop according to the phase offset value and a clock signal frequency received from the receiving phase locked loop. The receiving flip-flop is further configured to sample the data signal based on a pulse rising edge or a pulse falling edge of the clock signal to be sent to the receiving high speed transmission logic circuit. The receiving high speed transmission logic circuit is configured as a control logic and data transmission signal circuit.

It should be understood that the content described in the SUMMARY section is not intended to limit key or important features of the embodiments of the disclosure, nor to limit the scope of the disclosure. Other features of the disclosure will become apparent from the following description.

BRIEF DESCRIPTION OF THE DRAWINGS

The above and other features, advantages, and aspects of various embodiments of the disclosure will become more apparent when taken in conjunction with the drawings and with reference to the following detailed description. In the drawings, the same or similar reference numerals refer to the same or similar elements.

DETAILED DESCRIPTION OF DISCLOSED EMBODIMENTS

Embodiments of the disclosure will be described in more detail below with reference to the drawings. While certain embodiments of the disclosure are shown in the drawings, it should be understood that the disclosure may be embodied in various forms and should not be construed as limited to the embodiments set forth herein. The embodiments are provided for a more thorough and complete understanding of the disclosure. It should be understood that the drawings and embodiments of the disclosure are only for exemplary purposes, and are not intended to limit the protection scope of the disclosure.

In the description of embodiments of the disclosure, terms such as "including" should be understood as open-ended inclusion, that is, "including but not limited to". The term "based on" should be understood as "based at least partially on". The terms "an embodiment" or "the embodiment" should be understood as "at least one embodiment". Terms such as "first" and "second" may refer to different or the same object. The term "and/or" refers to at least one of the two items associated thereto. For example, "A and/or B" refers to A, B, or A and B. Other explicit and implicit definitions may also be included below.

It should be understood that for the technical solutions provided by the embodiments of the disclosure, in the introduction of the following specific embodiments, some repetitions may not be reiterated, and the specific embodiments should be regarded as being cross-referenced and combinable with each other.

As mentioned above, considering the manufacturing yield and cost of large dies, complex SoC designs are usually packaged in a multi-die module (MCM) package or a 2.5D interposer package to improve the manufacturing yield and reduce the total cost. The dies are then packaged together. In this case, the communication between the separated semiconductor dies is crucial to improving the performance of the semiconductor dies.

In some embodiments of the disclosure, for data transmission between dies, a die to die (D2D) reference clock distribution solution for data transmission is provided. Through using the solution, a reference clock signal with high quality and low jitter can be provided, so that the communication between dies has high reliability.

Figure 1:
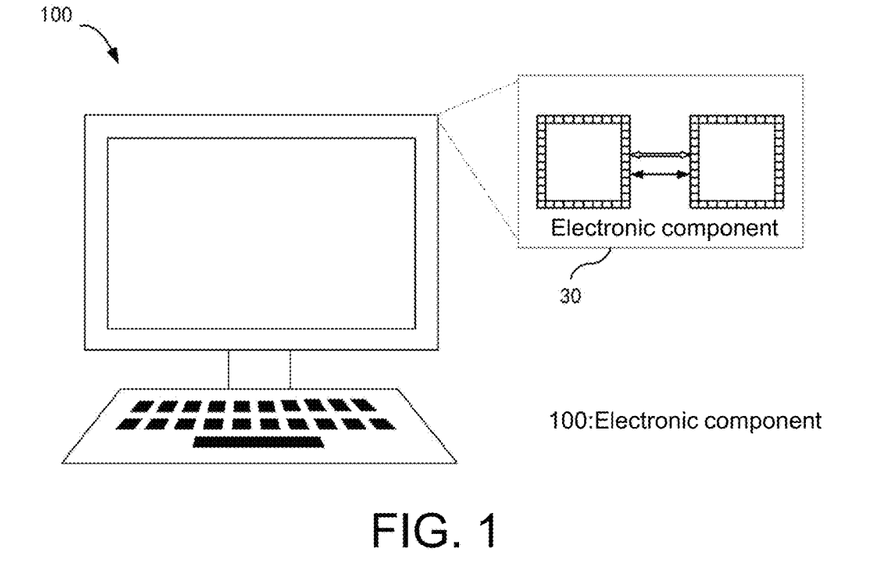
FIG. 1 is a schematic diagram of an electronic apparatus according to an embodiment of the disclosure.

FIG. 1 is a schematic diagram of an electronic apparatus according to an embodiment of the disclosure. In an embodiment, an electronic apparatus 100 is, for example, a computer. Other electronic apparatuses, such as a desktop computer, a laptop computer, a tablet computer, a smart phone, a wearable smart apparatus, an AI smart voice apparatus, or other smart terminal apparatuses, are also possible. The electronic apparatus 100 includes an electronic component 30 and other components not shown, such as other dies and sensors. The electronic component 30 may be formed as at least part of an integrated circuit system. In an embodiment, the electronic component 30 may include multiple package dies on a circuit board such as a printed circuit board (PCB) or a flexible printed circuit (FPC). Each package die may be packaged with one or more semiconductor dies. In another embodiment, the electronic component 30 itself is a single semiconductor die, such as a system in package (SiP) die integrated with multiple dies. The disclosure does not make any limitation on the form of the electronic component 30 herein.

Figure 2:
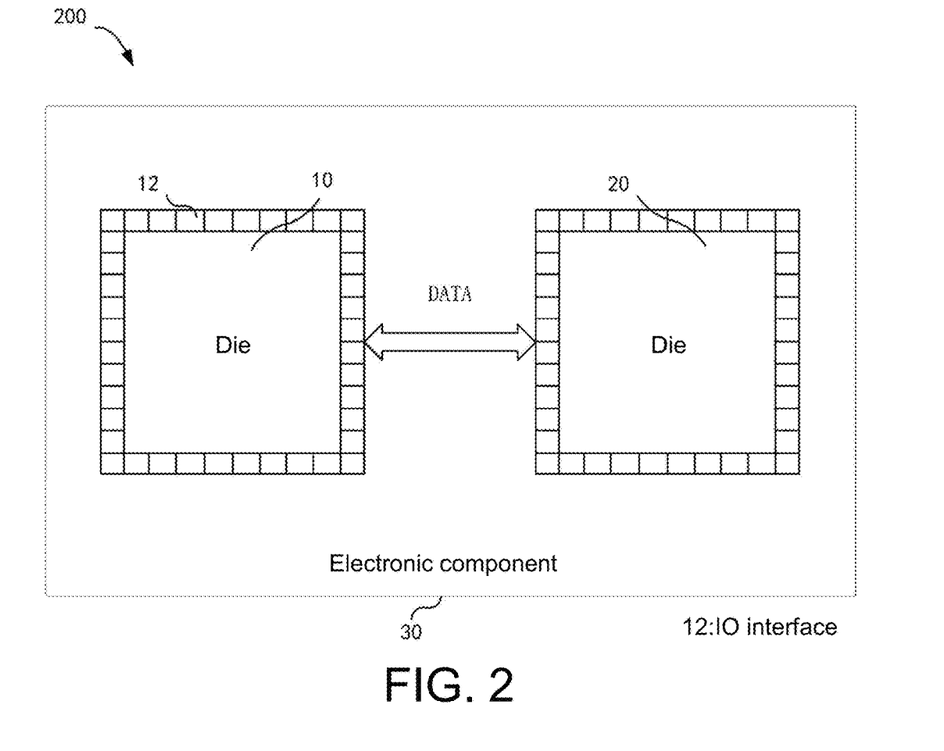
FIG. 2 is a simplified block diagram of an electronic component in the electronic apparatus of FIG. 1 according to an embodiment of the disclosure.

FIG. 2 is a simplified block diagram 200 of the electronic component 30 in the electronic apparatus of FIG. 1 according to an embodiment of the disclosure. In an embodiment, the electronic component 30 may be a SiP die or a printed circuit board integrated with a semiconductor die. The electronic component 30 may include a first die 10 and a second die 20 disposed on the circuit board, wherein the first die 10 and the second die 20 are both provided with multiple IO interfaces 12. The IO interface 12 includes, for example, an interface for communication according to a serializer-deserializer (SerDes) protocol, an interface for communication according to a PCIE protocol, an interface for communication according to a P2P protocol, etc. The electronic component may further include other dies or components not shown. The first die 10 and the second die 20 perform high speed data transmission through a stable and reliable clock signal CLK under the condition of satisfying power consumption and bandwidth. The first die 10 may include N transceiving channels for communicating with the second die 20, where N represents a natural number greater than 0. Correspondingly, the second die 20 may further include N transceiving channels communicating with the first die 10. It can be understood that the first die 10 and the second die 20 may also respectively have other transceiving channels for communicating with other dies or components. This disclosure does not make any limitation thereto. Taking the first die 10 as an example, the following describes the reference clock signal CLK for data transmission between semiconductor dies.

Figure 3:
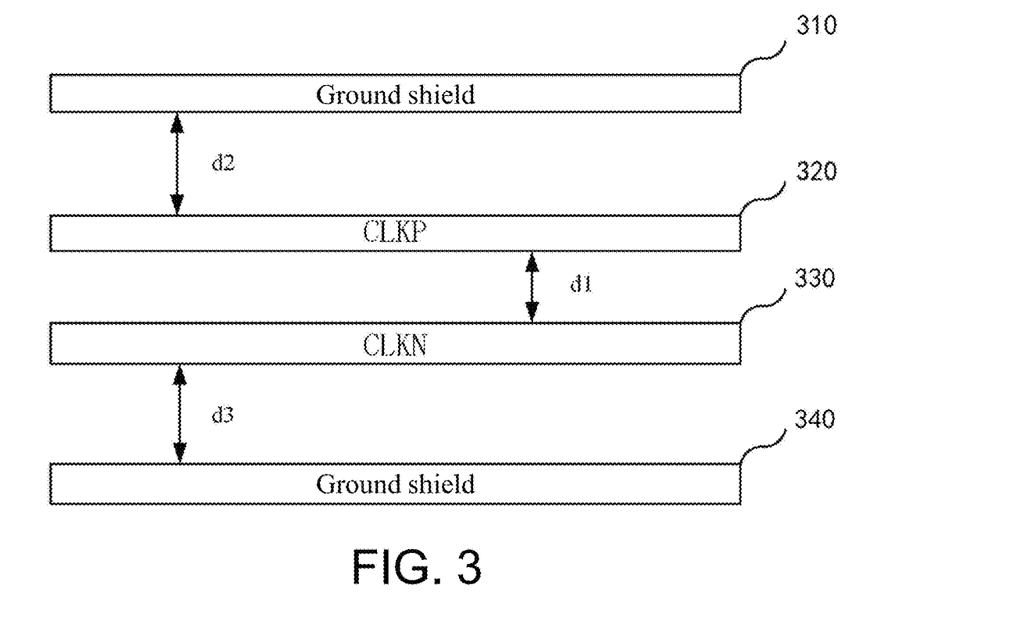
FIG. 3 shows a wiring manner of a reference clock signal according to an embodiment of the disclosure.

FIG. 3 shows a wiring manner of a differential clock signal according to an embodiment of the disclosure, which illustrates an implementation manner of clock signal transmission. Due to the strong anti-interference ability of the differential signal, in some embodiments of the disclosure, the reference clock signal of the semiconductor die adopts a differential current mode logic (CML) clock signal CLKP and a differential CML clock signal CLKN. The differential CML clock signals CLKP and CLKN are respectively transmitted in a first differential line 320 and a second differential line 330 which are arranged with differential wiring and are closely adjacent with a spacing d1, wherein the spacing d1 may be 2 microns or other spacings satisfying the differential wiring arrangement. A first ground shield 310 is disposed at a distance d2 from the first differential line 320, and a second ground shield 340 is disposed at a distance d3 from the second differential line 330 to improve the anti-interference ability of the differential lines. In an embodiment, the distances d2 and d3 are both 2.5 microns. The distances d2 and d3 may also be other values and do not need to be the same as each other. It should be understood that the reference clock signal of the semiconductor die of the embodiment of the disclosure may also adopt other types of transmission signals, which is not limited in the disclosure.

In addition, the total sending length of the differential CML signal is limited to a length not exceeding the range of 1000 micrometers to 4000 micrometers. In an embodiment, the sending length does not exceed 3200 microns to improve the stability of the differential CML signal and reduce clock signal jitter. Due to the loss during the transmission process of the differential CML signal, the number of cascading stages of signals is generally not more than 5, for example, not more than 3. In the embodiment of the disclosure, the maximum number of cascading stages of signals is 3, but it should be understood that other values are also possible according to requirements.

Figure 4:
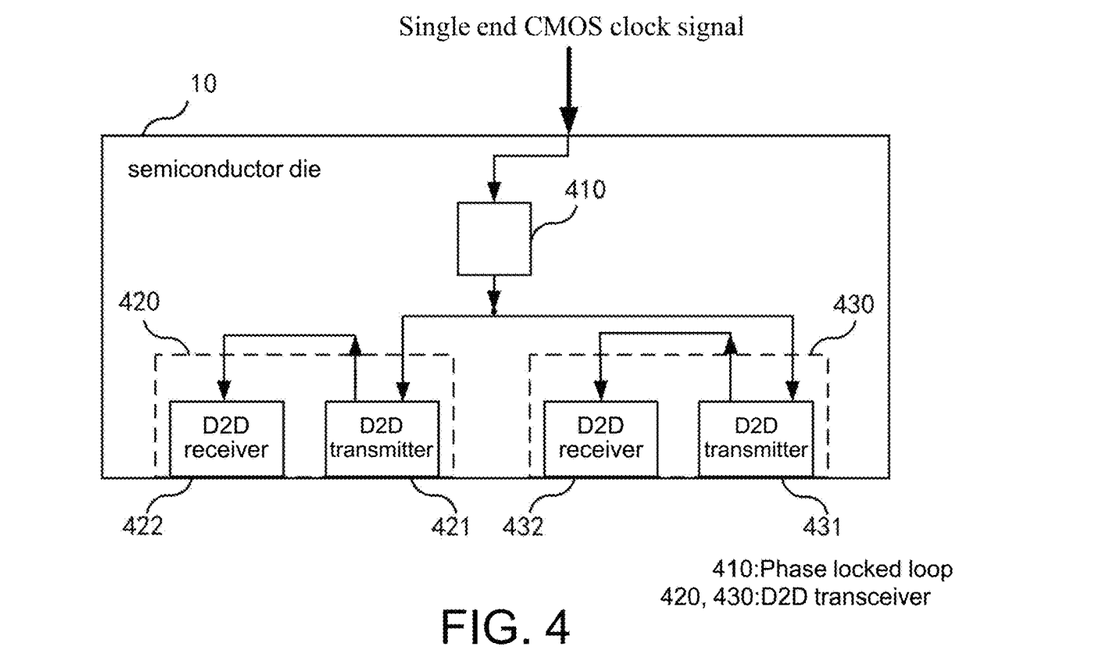
FIG. 4 is a schematic block diagram of reference clock signal transmission of a semiconductor die according to a first embodiment of the disclosure.

FIG. 4 is a schematic block diagram of reference clock signal transmission of a semiconductor die according to a first embodiment of the disclosure. The hardware configuration of the semiconductor die 10 in FIG. 4 is the same as or similar to the semiconductor die 10 in FIG. 2, so various aspects described with respect to the semiconductor die 10 in FIG. 2 may be applied to the semiconductor die 10 in FIG. 4, which will not be repeated.

In an embodiment, the semiconductor die 10 is, for example, an intelligent reasoning die, an intelligent training die, a general purpose GPU die, an edge computing GPU die, a general purpose CPU die, a specific CPU die, etc.

The semiconductor die 10 includes a phase locked loop 410, a first D2D transceiver 420, and a second D2D transceiver 430. In other embodiments, the semiconductor die 10 may include only one or more D2D transceivers. The phase locked loop 410 is configured to receive an initial reference clock signal, such as a single end CMOS clock signal, from a clock source outside the semiconductor die 10. The off-chip clock source includes, but is not limited to, a voltage controlled oscillator VCO, which, for example, generates a clock signal with a first frequency. The clock signal may be converted into a differential CML clock signal with a second frequency via a phase locked loop to be provided to the first D2D transceiver 420 and the second D2D transceiver 430. For example, the first frequency is 25 MHz and the second frequency is 100 MHz. Other frequencies are also possible according to the requirements of different application scenarios. Although the phase locked loop circuit shown in FIG. 4 may be configured to convert a single end signal into a differential signal, the same is merely illustrative and not limiting of the scope of the disclosure, and other differential signal conversion circuits are possible. It should be understood that the single end CMOS clock signal and the differential CML clock signal may also be other types of clock signals, such as pulse clock signals, which is not limited in the disclosure.

The first D2D transceiver 420 includes a first D2D transmitter 421 and a first D2D receiver 422. The first D2D transmitter 421 is configured to send data to another semiconductor die 20 (shown in FIG. 2) using a first reference clock signal, and the first D2D receiver 422 is configured to receive data from the semiconductor die 20 using a second reference clock signal. In an embodiment, the first reference clock signal and the second reference clock signal may be the same, such as the differential CML clock signal with the second frequency both from the phase locked loop 410. In this case, the first D2D transmitter 421 forwards the differential CML clock signal received from the phase locked loop 410 to the first D2D receiver 422 in series cascade. In other embodiments, the first reference clock signal and the second reference clock signal may be different, for example, as described in FIG. 5 below.

The third D2D transceiver 430 includes a third D2D transmitter 431 and a third D2D receiver 432, which respectively have the same or similar configurations as the first D2D transmitter 421 and the first D2D receiver 422, which will not be repeated. The semiconductor die 20 has the same or similar structural configuration as the semiconductor die 10. The semiconductor die 20 that performs data transmission with the semiconductor die 10 is not shown in FIG. 4. The semiconductor die 20 will be described in detail below through a second embodiment of the disclosure.

Figure 5:
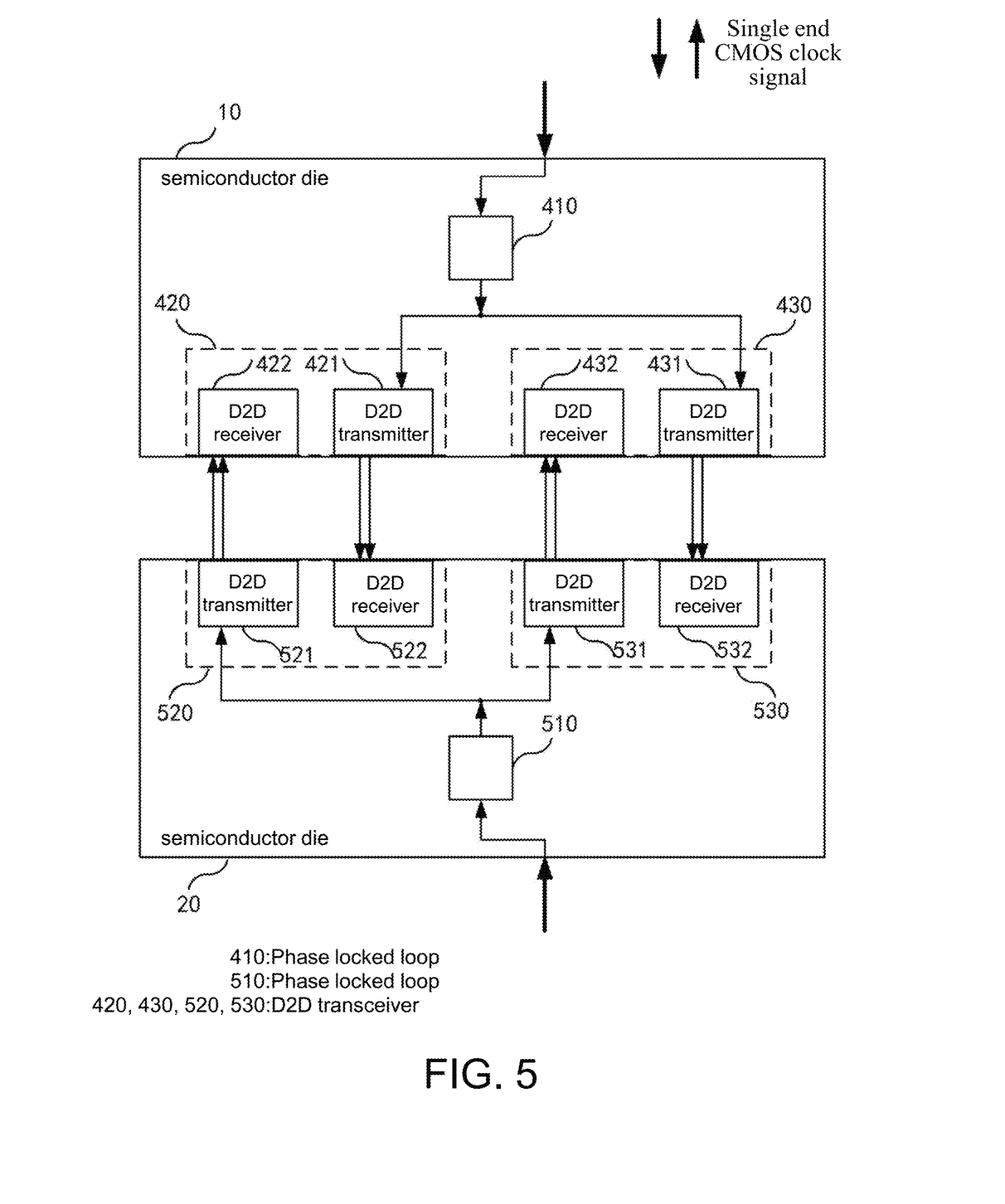
FIG. 5 is a schematic block diagram of reference clock signal transmission of a semiconductor die according to a second embodiment of the disclosure.

FIG. 5 is a schematic block diagram of reference clock signal transmission of a semiconductor die according to the second embodiment of the disclosure. The hardware configuration of the semiconductor die 10 in FIG. 5 is the same as or similar to the semiconductor die 10 in FIG. 4, so various aspects described with respect to the semiconductor die 10 in FIG. 4 may be applied to the semiconductor die 10 in FIG. 5, which will not be repeated.

The semiconductor die 20 is similar to the semiconductor die 10. The semiconductor die 20 includes a phase locked loop 510, a second D2D transceiver 520, and a fourth D2D transceiver 530. In another embodiment, the semiconductor die 20 may include only one or more D2D transceivers. The phase locked loop 510 is configured to receive an initial reference clock signal, such as a single end CMOS clock signal, from a clock source outside the semiconductor die 20. The external clock source that provides the initial reference clock signal to the semiconductor die 20 may be the same as or different from the external clock source that provides the initial reference clock signal to the semiconductor die 10. The off-chip clock source includes, but is not limited to, a voltage controlled oscillator VCO, which, for example, generates a clock signal with a first frequency or other frequencies. The clock signal may be converted into a differential CML clock signal with a second frequency or other frequencies via a phase locked loop to be provided to the second D2D transceiver 520 and the fourth D2D transceiver 530. For example, the first frequency is 25 MHz and the second frequency is 100 MHz. Other frequencies are also possible according to the requirements of different application scenarios. The phase locked loop circuit shown in FIG. 5 may be the same as or different from the phase locked loop 410 shown in FIG. 4, which is not limited in the disclosure.

The second D2D transceiver 520 includes a second D2D transmitter 521 and a second D2D receiver 522. The second D2D transmitter 521 is configured to send data to the semiconductor die 10 using a third reference clock signal, and the second D2D receiver 522 is configured to receive data from the semiconductor die 10 using a fourth reference clock signal. The fourth D2D transceiver 530 includes a fourth D2D transmitter 531 and a fourth D2D receiver 532, which respectively have the same or similar configurations as the second D2D transmitter 520 and the second D2D receiver 522, which will not be repeated.

In the embodiment, the third reference clock signal is different from the fourth reference clock signal. The third reference clock signal is, for example, the reference clock signal with the second frequency from the phase locked loop 510, and the fourth reference clock signal is a reference clock signal with a frequency different from the second frequency received from another die. As shown in FIG. 5, the second D2D receiver 522 and the fourth D2D receiver 532 of the semiconductor die 20 respectively receive the differential CML clock signal from the first D2D transmitter 422 and the third D2D transmitter 432 as the fourth reference clock signal for data transmission without receiving the differential CML clock signal from the transmitters (for example, the second D2D transmitter 521 and the fourth D2D transmitter 531 shown in FIG. 5) in the respective transceivers.

Different from FIG. 4, the first D2D receiver 422 and the third D2D receiver 432 of the semiconductor die 10 in FIG. 5 respectively receive the differential CML clock signal from the second D2D transmitter 521 and the fourth D2D transmitter 531 as the second reference clock signal for data transmission without receiving the differential CML clock signal from the transmitters (for example, the first transmitter 421 and the third transmitter 431 shown in FIG. 5) in the respective transceivers. In the embodiment, the first to fourth reference clock signals may be different from one another. In another embodiment, the first reference clock signal may be the same as the third reference clock signal, and the second reference clock signal may be the same as the fourth reference clock signal.

In the case where the external clock sources supplied to the semiconductor dies 10 and 20 are the same and the arrangements of the semiconductor dies 10 and 20 are also the same, the reference clock signals for inter-die data transmission between the D2D transceivers of the semiconductor dies 10 and 20 are synchronized with each other, thereby ensuring high speed, stable, and reliable data transmission between the dies.

Figure 6:
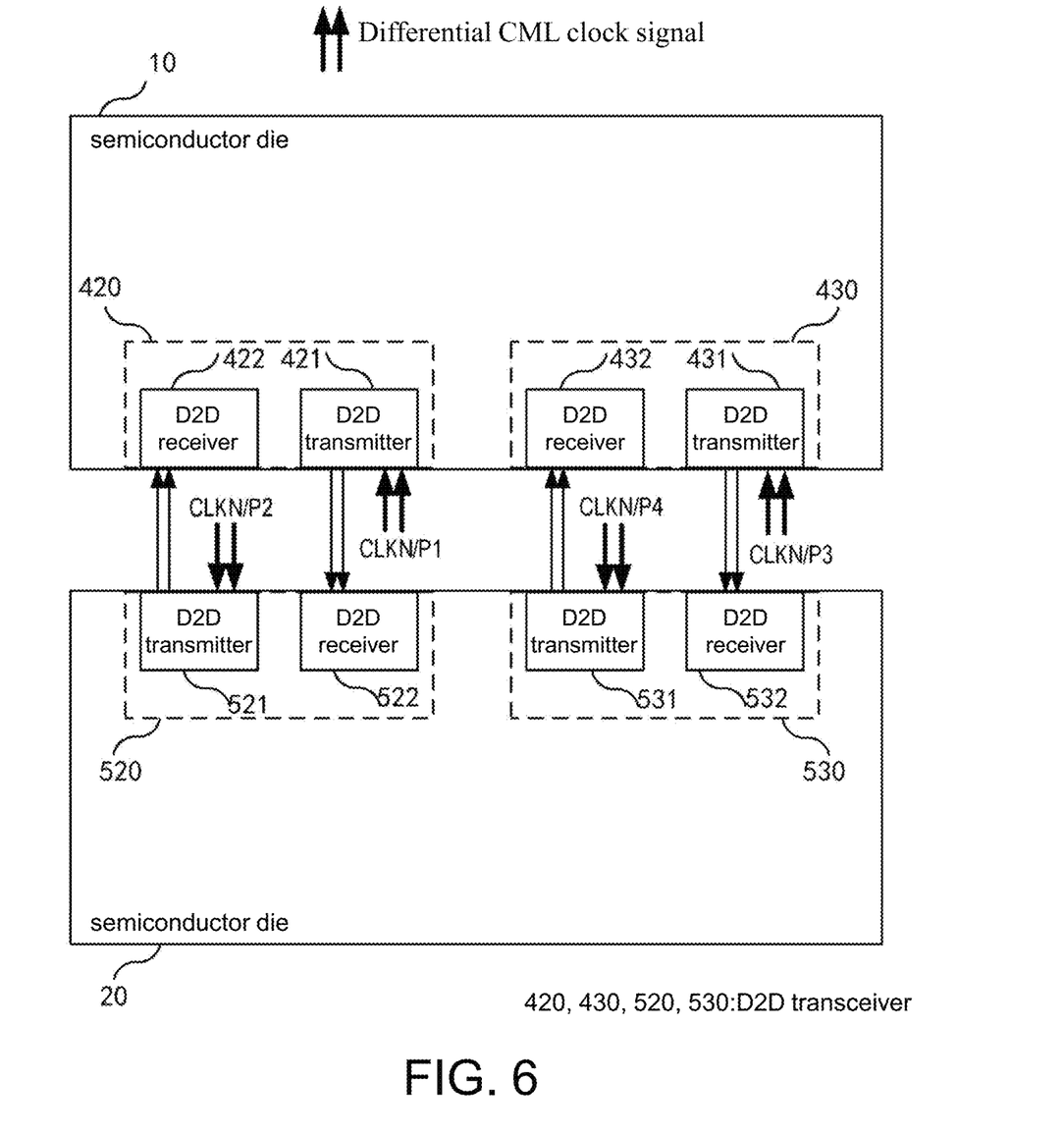
FIG. 6 is a schematic block diagram of reference clock signal transmission of a semiconductor die according to a third embodiment of the disclosure.

FIG. 6 is a schematic block diagram of reference clock signal transmission of a semiconductor die according to a third embodiment of the disclosure. The hardware configurations of the semiconductor dies 10 and 20 in FIG. 6 are the same as or similar to the semiconductor dies 10 and 20 in FIG. 5, so various aspects described with respect to the semiconductor dies 10 and 20 in FIG. 5 may be applied to the semiconductor dies 10 and 20 in FIG. 5, which will not be repeated.

Compared with FIG. 5, the difference of FIG. 6 is that differential CML clock signals CLKN/P1 and CLKN/P3 are directly provided to the first D2D transmitter 421 in the first D2D transceiver 420 and the third D2D transmitter 431 in the third D2D transceiver 430 of the semiconductor die 10 through the differential CML clock signal source outside the semiconductor die. Differential CML clock signals CLKN/P2 and CLKN/P4 from the external differential CML clock signal source are also provided to the second D2D transmitter 521 in the second transceiver 520 and the fourth D2D transmitter 531 in the fourth D2D transceiver 530 of the semiconductor die 20. The differential CML clock signals CLKN/P1 to CLKN/P4 may be the same or different clock signals from the same or different differential CML clock signal sources, which is not limited in the disclosure. The differential CML clock signal source may be any differential CML clock signal from a differential CML clock signal generator, which is not limited in the disclosure.

The transmission of the data and the reference clock signal between the semiconductor dies 10 and 20 is similar to the transmission of the data and the reference clock signal in FIG. 5, which will not be repeated.

In an embodiment, through directly providing the differential CML clock signal from outside the die to the D2D transmitter (for example, the first D2D transmitter 421, the third D2D transmitter 431, the second D2D transmitter 521, and the fourth D2D transmitter 531) in the D2D transceiver and limiting the number of transmission stages of the reference clock, the transmission loss of the signal can be reduced, the occupied area of parts used on the die can be reduced, and the planning and design of a backup reference clock signal can be provided without waiting for the tape-out cycle when the phase locked loop circuit in the die fails.

The semiconductor dies 10 and 20 in the embodiments of FIG. 4 to FIG. 6 support an application scenario of a high speed IO interface, that is, a D2D application scenario. However, the embodiment according to the disclosure is not limited thereto. The semiconductor die may also be applied to other application scenarios, such as a multi-application scenario supporting multiple IO interfaces. The multi-application scenario includes, but is not limited to, various different combinations of the D2D transmission scenario described above, a point to point (P2P) transmission scenario, and a high speed PCIE host transmission scenario.

Figure 7:
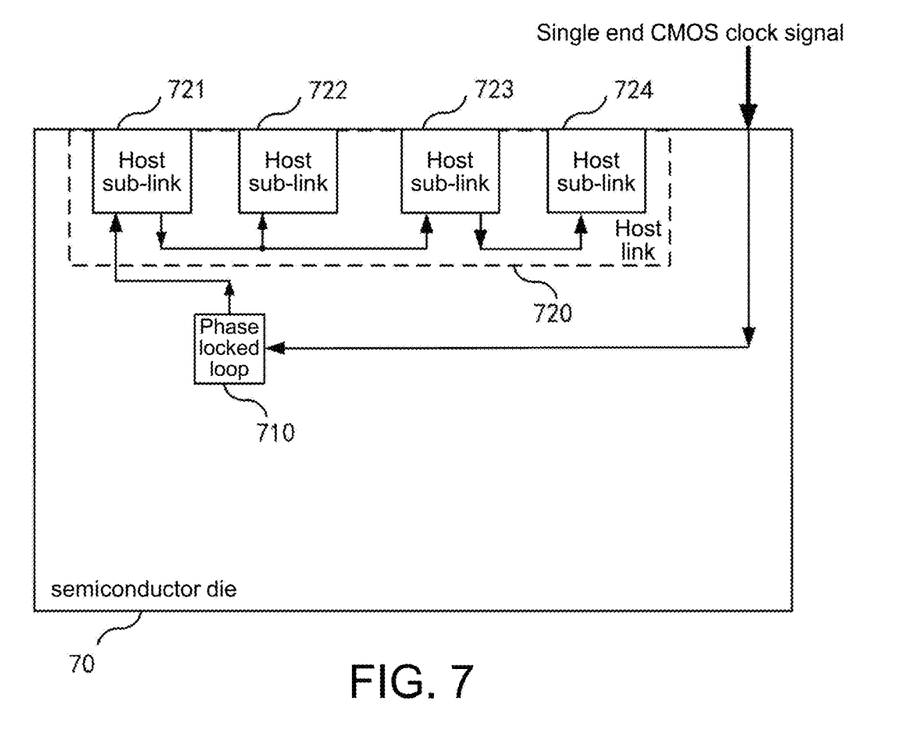
FIG. 7 is a schematic block diagram of reference clock signal transmission of a semiconductor die according to a fourth embodiment of the disclosure.

FIG. 7 is a schematic block diagram of reference clock signal transmission of a semiconductor die according to a fourth embodiment of the disclosure. In FIG. 7, the PCIE host scenario is described. It can be understood that a semiconductor die 70 in FIG. 7 may further include other interface circuits to be applied to other scenarios, such as a D2D scenario. The semiconductor die 70 includes a phase locked loop 710 and a host link 720. The host link 720 is configured to communicate with a host using a reference clock signal to transmit data. The phase locked loop 710 receives a single end CMOS clock signal from an external clock source, and converts the single end CMOS clock signal into a differential CML clock signal to be provided to the host link 720 for data transmission. In an embodiment, the phase locked loop 710 is the same as or similar to the phase locked loop 410 or 510 in FIG. 4 or 5. In another embodiment, the phase locked loop 710 may be another phase locked loop different from the phase locked loops 410 and 510.

The host link 720 includes first to fourth host sub-links 721 to 724 in series cascade, wherein each sub-link may include, but is not limited to, 4 communication channels. In an embodiment, under the condition of satisfying the clock signal transmission specification, the host link 720 may include fewer or more host sub-links, such as 3 host sub-links or 5 host sub-links.

In an embodiment, the first host sub-link 721 receives the differential CML clock signal from the phase locked loop 710. The differential CML clock signal is transmitted to a second host sub-link 722 and a third host sub-link 723 through the first host sub-link 721 for data transmission. Then, the third host sub-link 723 transmits the differential CML clock signal to the fourth host sub-link 724 for data transmission. In the example shown in FIG. 7, the number of transmission stages of the differential CML clock signal is 2, and during the transmission process, there is no analog/digital circuit, which effectively reduces the loss of signal transmission, improves the quality of the reference clock signal, and reduces signal jitter.

Figure 8:
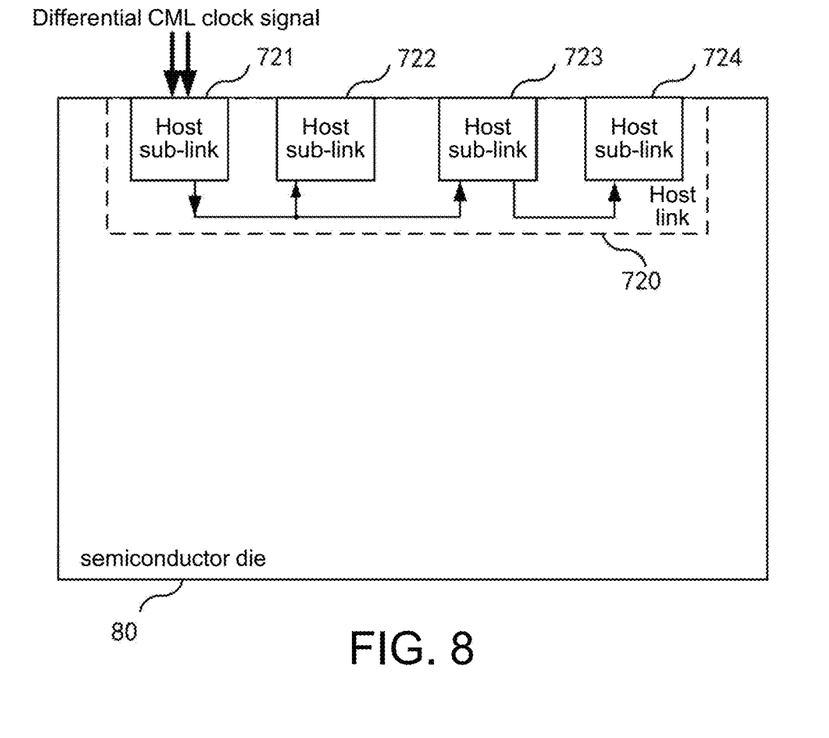
FIG. 8 is a schematic block diagram of reference clock signal transmission of a semiconductor die according to a fifth embodiment of the disclosure.

FIG. 8 is a schematic block diagram of reference clock signal transmission of a semiconductor die according to a fifth embodiment of the disclosure. Similar to FIG. 7, a semiconductor die 80 in FIG. 8 further includes a host link 720 for transmitting data. The difference between FIG. 8 and FIG. 7 is that the first host sub-link 721 receives a differential CML clock signal from an external clock source instead of generating the differential CML clock signal using the phase locked loop (as shown in FIG. 7) in the die.

By directly providing the differential CML clock signal to a first host sub-link 821 in a host link 820 through an off-chip clock source, the transmission loss of the signal can be reduced, the occupied area of parts used on the die can be reduced, and the planning and design of a backup reference clock signal can be provided when the phase locked loop circuit in the die fails, which provides the product with extremely strong robustness.

Figure 9:
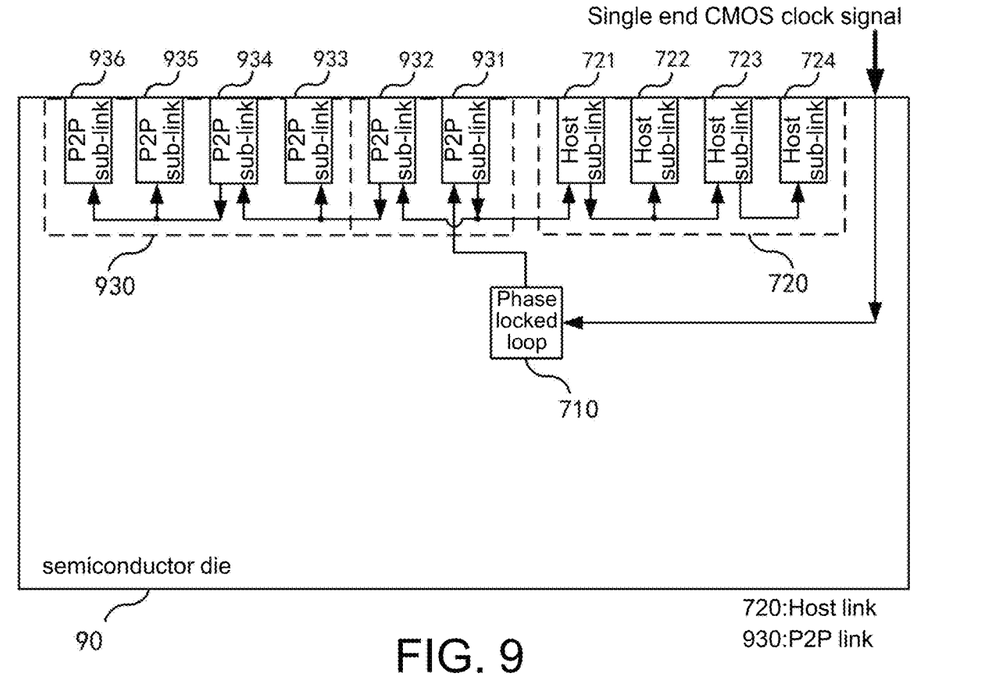
FIG. 9 is a schematic block diagram of reference clock signal transmission of a semiconductor die according to a sixth embodiment of the disclosure.

FIG. 9 is a schematic block diagram of reference clock signal transmission of a semiconductor die according to a sixth embodiment of the disclosure. In FIG. 9, a P2P host scenario is described. It can be understood that a semiconductor die 90 may further include other interface circuits to be applied to other scenarios, such as a D2D scenario and/or a host scenario. The semiconductor die 90 includes a point to point (P2P) link 930, and the host link 720 shown in FIG. 7 and FIG. 8 and the phase locked loop 710 shown in FIG. 7. The P2P link 930 is configured to establish a communication channel with a same-stage external electronic device in a peer to peer network for data transmission. The external electronic device may be any communication device in the peer to peer network, which is not limited in any form in the disclosure.

The phase locked loop 710 is configured to receive an initial reference clock signal, such as a single end CMOS clock signal, from a clock source outside the semiconductor die 90. The off-chip clock source includes, but is not limited to, a voltage controlled oscillator VCO, which, for example, generates a clock signal with a first frequency. The clock signal may be converted into a differential CML clock signal with a second frequency via a phase locked loop to be provided to the P2P link 930 for data transmission. For example, the first frequency is 25 MHz and the second frequency is 100 MHz. Other frequencies are also possible according to the requirements of different application scenarios.

The P2P link 930 includes first to sixth P2P sub-links 931 to 936, wherein each sub-link may include, but is not limited to, 4 links. In an embodiment, under the condition of satisfying the clock signal transmission specification, the P2P link 930 may include fewer or more P2P sub-links, such as 2 P2P sub-links or 5 P2P sub-links.

The first P2P sub-link 931 receives the differential CML clock signal from the phase locked loop 710, and sends the differential CML clock signal to the first host sub-link 721 and the second P2P sub-link 932 for data transmission. The first host sub-link 721 transmits the received differential CML clock signal to the subsequent stage, wherein a signal transmission path in the host link is the same as the transmission path of the host sub-link in FIG. 7 and FIG. 8, and will not be repeated.

The first P2P sub-link transmits the received differential CML clock signal to the subsequent stage, for example, transmits the differential CML clock signal to the second P2P sub-link 932. The differential CML clock signal may also be transmitted to the third P2P link under the condition of satisfying the differential signal transmission condition, which is not limited in the disclosure.

The second P2P sub-link 932 transmits the received differential CML clock signal to the third and fourth P2P sub-links 933 and 934 for data transmission. The fourth P2P sub-link 934 transmits the received differential CML clock signal to the fifth and sixth P2P sub-links 935 and 936 for data transmission.

In the embodiment, the P2P link may be turned off under the following circumstances, such as according to the requirements of the application scenario, reducing power consumption, or failure, and only the PCIE host application scenario as shown in FIG. 7 or FIG. 8 is supported. In this case, the first host sub-link no longer receives the differential CML clock signal via the first P2P sub-link, but may independently receive the differential CML clock signal from a clock source outside the semiconductor die or a phase locked loop in the die. Therefore, the flexibility of the semiconductor die configuration is improved through freely switching between the P2P link and the host link.

In an embodiment, in the transmission path of the host link or the P2P link, the number of stages of signal transmission is 3. During the transmission process, there is no analog/digital circuit, which effectively reduces the loss of signal transmission, improves the quality of the reference clock signal, and reduces signal jitter.

Figure 10:
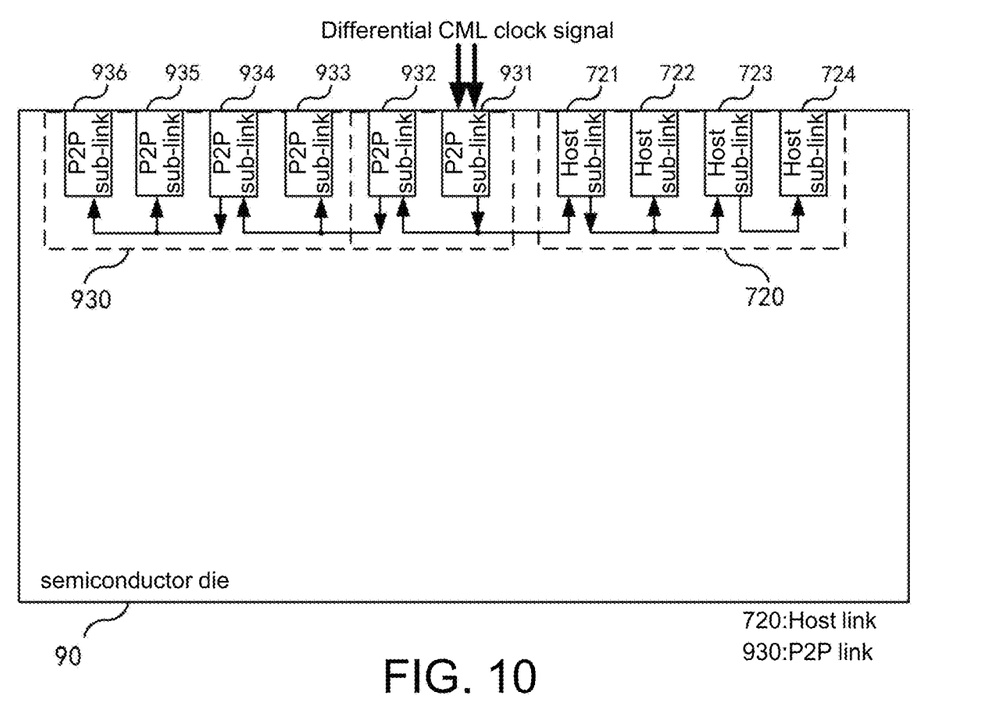
FIG. 10 is a schematic block diagram of reference clock signal transmission of a semiconductor die according to a seventh embodiment of the disclosure.

FIG. 10 is a schematic block diagram of reference clock signal transmission of a semiconductor die according to a seventh embodiment of the disclosure. The semiconductor die 90 includes the host link 720 and the P2P link 930. The hardware configurations of the host link 720 and the P2P link 930 in FIG. 10 are the same as or similar to the phase locked loop 720 and the P2P link in FIG. 9, so various aspects described with respect to the phase locked loop 720 and the P2P link in FIG. 9 may be applied to the semiconductor die 90 in FIG. 10, which will not be repeated.

The semiconductor die of FIG. 10 is compared with FIG. 9, the difference is that by directly providing the differential CML clock signal to the first P2P sub-link in the P2P link through an off-chip clock source, the transmission loss of the signal can be reduced, the occupied area of parts used on the die can be reduced, and the planning and design of a backup reference clock signal can be provided without re-taping when the phase locked loop circuit in the die fails.

Figure 11:
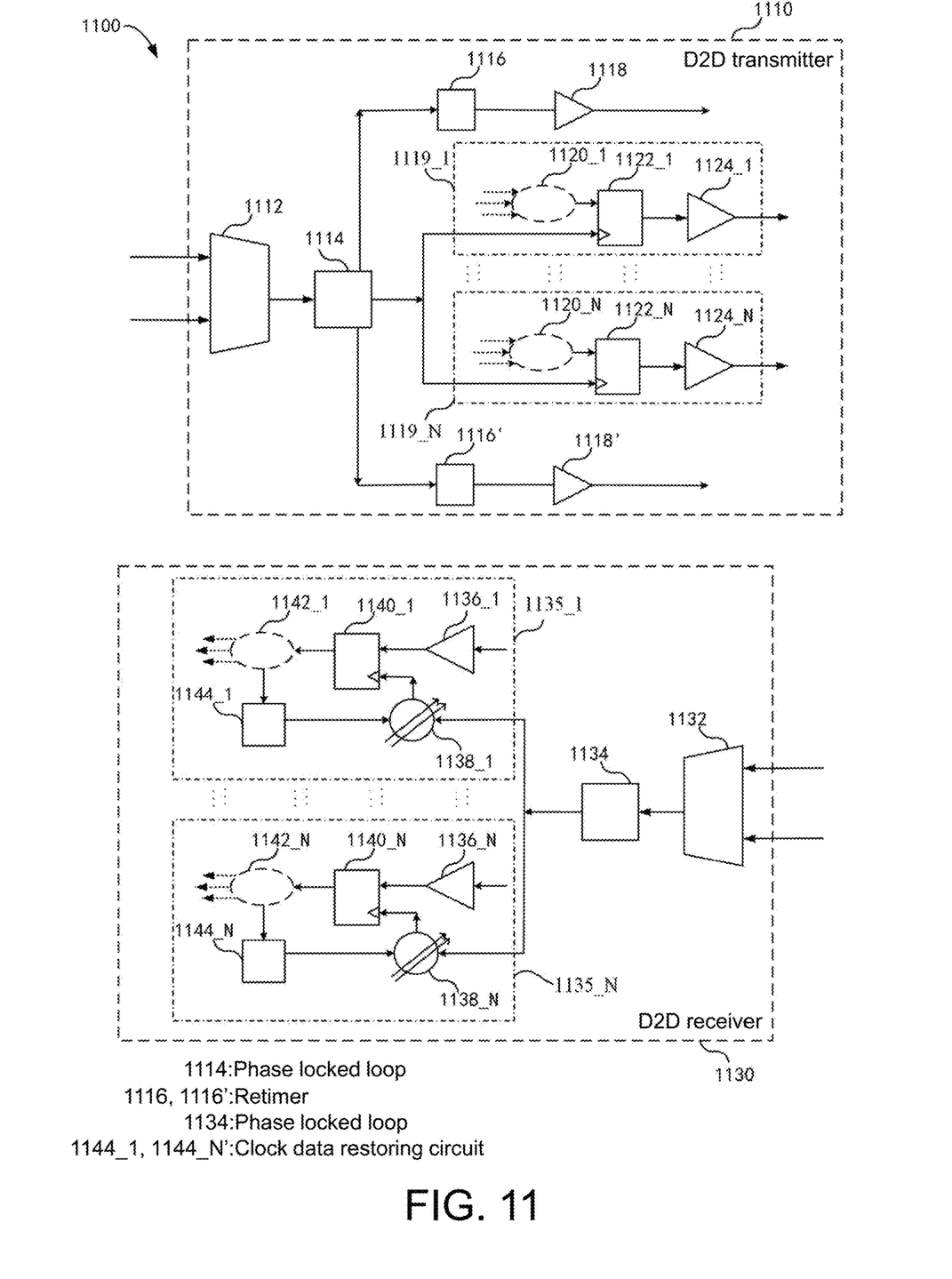
FIG. 11 is a schematic block diagram of a circuit structure of a D2D transceiver in a semiconductor die according to an embodiment of the disclosure.

The structure of the D2D transceiver in the semiconductor die of the above embodiments will be described below with reference to FIG. 11. FIG. 11 is a schematic block diagram of a circuit structure of a D2D transceiver 1100 in a semiconductor die according to the above embodiments of the disclosure. In an embodiment, the D2D transceiver 1100 includes a D2D transmitter 1110 and a D2D receiver 1130. In another embodiment, the D2D transceiver 1100 may include multiple D2D transmitters 1110 and D2D receivers 1130. Although FIG. 11 shows the configurations of the D2D transmitter 1110 and the D2D receiver 1130 in the same semiconductor die, the same may also be configured in different semiconductor dies according to different application scenarios (for example, a single die or dual dies). The D2D transmitter 1100 is configured to receive a reference clock signal, and to send a clock signal for transmitting data to the D2D receiver 1130 based on the reference clock signals from different clock signal sources according to different application scenarios (for example, for example, an on-chip clock source or an off-chip clock source). The D2D transmitter is further configured to transmit data to the D2D receiver 1130 based on the received reference clock signal.

As shown in the upper part of FIG. 11, the D2D transmitter 1110 includes a multiplexer 1112, a phase locked loop 1114, a retimer 1116/1116', a clock buffer 1118/1118', and N sending channels 1119_1 to 1119N (collectively referred to as 1119). The multiplexer 1112 is supplied with multiple reference clock signals to provide appropriate reference clock signals to the phase locked loop 1114 according to different application scenarios. The phase locked loop 1114 is configured to generate the clock signals sent to the D2D receiver 1130 and for transmitting data to the D2D receiver based on the received reference clock signals according to different application scenarios. The sending channel 1119 is configured to transmit data to the D2D receiver based on the clock signal sent from the phase locked loop 1114.

In an embodiment, the sending channel 1119 includes high speed transmission logic circuits 1120_1 to 1120N (collectively referred to as 1120), flip-flops 1122_1 to 1122N (collectively referred to as 1122), and output buffers 1124_1 to 1124N (collectively referred to as 1124). The high speed transmission logic circuit 1120 is configured as a control logic and data transmission functional block, and sends clock and data streams to the flip-flop 1122. The flip-flop 1122 receives the clock signal from the phase locked loop and samples a high speed serial data stream based on a pulse rising edge or a pulse falling edge of the clock signal to be sent to the output buffer 1124. The disclosure does not limit the structure, the triggering manner, and the function of the flip-flop 1122, which includes, but is not limited to, a synchronous flip-flop, a master-slave flip-flop, an integrated flip-flop, etc. In the embodiment, the configurations of the sending channel 1119 and the high speed transmission logic circuit 1120, the flip-flop 1122, and the output buffer 1124 included therein may be the same as or different from one another, which is not limited in the disclosure.

The clock signal generated by the phase locked loop 1114 generates the clock signal for data transmission sent to the D2D receiver through the retimer 1116/1116' and the clock buffer 1118/1118'. The retimer 1116/1116' is configured to pass the clock signal through a clock reconstruction signal therein to increase the signal transmission energy to offset the loss during the transmission process, thereby reducing signal jitter. The clock buffer 1118/1118' is configured to generate an accurate clock signal with better edges at lower power consumption. In an embodiment, the structure and the function of the clock buffer 1118/1118' may be the same as or different from the output buffer 1124, which is not limited in the disclosure.

The D2D receiver 1130 receives a high quality clock signal and data signal from the D2D transmitter 1110 for data transmission. As shown in the lower part of FIG. 11, the D2D receiver 1130 includes a multiplexer 1132, a phase locked loop 1134, and N receiving channels 1135_1 to 1135N (collectively referred to as 1135). The multiplexer 1132 receives the high quality clock signal from the D2D receiver to be sent to the phase locked loop 1134. The multiplexer 1132 and the phase locked loop 1134 respectively have the same or similar configurations as the multiplexer 1112 and the phase locked loop 1114, which will not be repeated here.

In an embodiment, the receiving channel 1135 includes input buffers 1136_1 to 1136N (collectively referred to as 1136), phase interpolators 1138_1 to 1138N (collectively referred to as 1138), flip-flops 1140_1 to 1140N (collectively referred to as 1140), high speed transmission logic circuits 1142_1 to 1142N (collectively referred to as 1142), and clock data restoring circuits 1144_1 to 1144N (collectively referred to as 1144).

The input buffer 1136 is configured to receive data transmitted from the D2D transmitter, and to generate an accurate data signal with better edges at lower power consumption to be sent to the flip-flop 1140. The data signal is sent to the clock data restoring circuit 1144 via the flip-flop 1140 and the high speed transmission logic circuit 1142. The clock data restoring circuit 1144 is configured to execute data restoration to determine a phase of the data signal, that is, to determine the phase offset value, and to send the determined phase offset value to the phase interpolator 1138. The phase interpolator 1138 sends a phase-accurate clock signal to the flip-flop according to the phase offset value and a clock signal frequency received from the receiving phase locked loop 1134. The flip-flop 1140 is further configured to sample the data signal based on a pulse rising edge or a pulse falling edge of the clock signal to be sent to the high speed transmission logic circuit 1142. The high speed transmission logic circuit 1142 is configured to control logic and data transmission flow.

In an embodiment, the input buffer 1136, the flip-flop 1140, and the high speed transmission logic circuit 1142 may respectively have the same or similar configurations as the high speed transmission logic circuit 1120, the flip-flop 1122, and the output buffer 1124. Likewise, the configurations of the receiving channel 1135 and the input buffer 1136, the flip-flop 1140, the high speed transmission logic circuit 1142, the clock data restoring circuit 1144, and the phase interpolator 1138 included therein may be the same as or different from one another, which is not limited in the disclosure.

The structure of the D2D transceiver in the semiconductor die has been described above. Although different implementation manners of the semiconductor die including the D2D transceiver are described above for different application scenarios, the above application scenarios do not limit the scope of the disclosure. The die configuration for each of the above application scenarios may be flexibly configured in a single die according to requirements. For example, all configurations for the above application scenarios may be included in a single die or configurations of any combination of partial scenarios may be provided according to requirements. According to the above embodiments, the semiconductor die of the disclosure may be freely switched between different application scenarios through different reference clock configurations. A one-stop design solution of the reference clock is provided to meet the requirements of different application scenarios. Switching between different application scenarios may be implemented through a switch circuit matrix, which is not limited in the disclosure.

Embodiments may be further described using the following clauses.

Clause 1. A semiconductor die, including:
a first die to die (D2D) transceiver, including:
a first D2D transmitter, configured to send data to a second D2D receiver in a second D2D transceiver of another semiconductor die using a first reference clock signal; and
a first D2D receiver, configured to receive data from a second D2D transmitter in the second D2D transceiver using a second reference clock signal.

Clause 2. The semiconductor die according to Clause 1, further including:
a first phase locked loop, configured to receive an initial reference clock signal from outside the semiconductor die, and to provide the first reference clock signal to the first D2D transmitter, wherein the first D2D receiver is configured to receive the second reference clock signal from the first D2D transmitter or to receive the second reference clock signal from the second D2D transmitter, and the second reference clock signal is the same as the first reference clock signal.

Clause 3. The semiconductor die according to Clause 1 or 2, wherein the first D2D transmitter is further configured to provide the first reference clock signal to the second D2D receiver.

Clause 4. The semiconductor die according to Clause 2, further including:
a third D2D transceiver, including:
a third D2D transmitter, configured to send data to a fourth D2D receiver in a fourth D2D transceiver of the another semiconductor die using the first reference clock signal; and
a third D2D receiver, configured to receive data from a fourth D2D transmitter in the fourth D2D transceiver using the second reference clock signal.

Clause 5. The semiconductor die according to Clause 4, wherein the first phase locked loop is further configured to provide the first reference clock signal to the third D2D transmitter, wherein the third D2D receiver is configured to receive the second reference clock signal from the third D2D transmitter or the fourth D2D transmitter in the fourth D2D transceiver.

Clause 6. The semiconductor die according to Clause 1, wherein the first D2D transmitter is configured to receive the first reference clock signal from outside the semiconductor die, and to send the first reference clock signal to the second D2D receiver; and the first D2D receiver is configured to receive the second reference clock signal from the second D2D transmitter.

Clause 7. The semiconductor die according to Clause 6, further including:
a third D2D transceiver, including:
a third D2D transmitter, configured to receive the first reference clock signal from outside the semiconductor die and to send data and the first reference clock signal to a fourth D2D receiver in a fourth D2D transceiver of the another semiconductor die using the first reference clock signal; and
a third D2D receiver, configured to receive the second clock signal from a fourth D2D transmitter in the fourth D2D transceiver and to receive data from the fourth D2D transmitter in the fourth D2D transceiver using the second reference clock signal.

Clause 8. The semiconductor die according to any one of Clauses 1 to 7, further including: a host link, configured to communicate with a host to transmit the data, the host link including:
a first host sub-link, configured to transmit the data using a third reference clock signal;
a second host sub-link, configured to receive the third reference clock signal from the first host sub-link;
a third host sub-link, configured to receive the third reference clock signal from the first host sub-link; and
a fourth host sub-link, configured to receive the third reference clock signal from the third host sub-link.

Clause 9. The semiconductor die according to Clause 8, wherein the first host sub-link is further configured to receive the first reference clock signal from a second phase locked loop or a point to point (P2P) link or to receive the first reference clock signal from outside the semiconductor die.

Clause 10. The semiconductor die according to any one of Clauses 1 to 9, further including:
a P2P link, configured to establish a communication channel with an external electronic device to transmit the data, the P2P link including:
a first P2P sub-link, configured to establish a first communication channel with the external electronic device to transmit the data using a fourth reference clock signal from outside the semiconductor die or the second phase locked loop.

Clause 11. The semiconductor die according to Clause 10, wherein the P2P link further includes:
a second P2P sub-link, configured to establish a second communication channel with the external electronic device to transmit the data using the fourth reference clock signal received from the first P2P sub-link.

Clause 12. The semiconductor die according to Clause 11, wherein the P2P link further includes:
a third P2P sub-link, configured to establish a third communication channel with the external electronic device to transmit the data using the fourth reference clock signal received from the second P2P sub-link;
a fourth P2P sub-link, configured to establish a fourth communication channel with the external electronic device to transmit the data using the fourth reference clock signal received from the second P2P sub-link;
a fifth P2P sub-link, configured to establish a fifth communication channel with the external electronic device to transmit the data using the fourth reference clock signal received from the fourth P2P sub-link; and
a sixth P2P sub-link, configured to establish a sixth communication channel with the external electronic device to transmit the data using the fourth reference clock signal received from the fourth P2P sub-link.

Clause 13. An electronic component, including:
a circuit board; and
the semiconductor die according to any one of Clauses 1 to 12, disposed on the circuit board.

Clause 14. An electronic apparatus, including: the electronic component according to Clause 13.

Clause 15. A method for manufacturing a semiconductor die, including:
providing a first die to die (D2D) transceiver, the first D2D transceiver including:
a first D2D transmitter, configured to send data to a second D2D receiver in a second D2D transceiver of another semiconductor die using a first reference clock signal; and a first D2D receiver, configured to receive data from a second D2D transmitter in the second D2D transceiver using a second reference clock signal.

Clause 16. A semiconductor die, including: a host link, configured to communicate with a host to transmit the data, the host link including:
a first host sub-link, configured to transmit the data using a third reference clock signal;
a second host sub-link, configured to receive the third reference clock signal from the first host sub-link;
a third host sub-link, configured to receive the third reference clock signal from the first host sub-link; and
a fourth host sub-link, configured to receive the third reference clock signal from the third host sub-link.

Clause 17. The semiconductor die according to Clause 16, wherein the first host sub-link is further configured to receive the first reference clock signal from a second phase locked loop or a point to point (P2P) link or to receive the first reference clock signal from outside the semiconductor die.

Clause 18. The semiconductor die according to any one of Clauses 16 and 17, further including:
a P2P link, configured to establish a communication channel with an external electronic device to transmit the data, the P2P link including:
a first P2P sub-link, configured to establish a first communication channel with the external electronic device to transmit the data using a fourth reference clock signal from outside the semiconductor die or the second phase locked loop.

Clause 19. The semiconductor die according to Clause 18, wherein the P2P link further includes:
a second P2P sub-link, configured to establish a second communication channel with the external electronic device to transmit the data using the fourth reference clock signal received from the first P2P sub-link.

Clause 20. The semiconductor die according to Clause 19, wherein the P2P link further includes:
a third P2P sub-link, configured to establish a third communication channel with the external electronic device to transmit the data using the fourth reference clock signal received from the second P2P sub-link;

a fourth P2P sub-link, configured to establish a fourth communication channel with the external electronic device to transmit the data using the fourth reference clock signal received from the second P2P sub-link;

a fifth P2P sub-link, configured to establish a fifth communication channel with the external electronic device to transmit the data using the fourth reference clock signal received from the fourth P2P sub-link; and a sixth P2P sub-link, configured to establish a sixth communication channel with the external electronic device to transmit the data using the fourth reference clock signal received from the fourth P2P sub-link.

Clause 21. The semiconductor die according to Clauses 16 to 20, further including: a first die to die (D2D) transceiver, including:

a first D2D transmitter, configured to send data to a second D2D receiver in a second D2D transceiver of another semiconductor die using a first reference clock signal; and a first D2D receiver, configured to receive data from a second D2D transmitter in the second D2D transceiver using a second reference clock signal.

Clause 22. The semiconductor die according to Clause 21, further including:

a first phase locked loop, configured to receive an initial reference clock signal from outside the semiconductor die, and to provide the first reference clock signal to the first D2D transmitter, wherein the first D2D receiver is configured to receive the second reference clock signal from the first D2D transmitter or to receive the second reference clock signal from the second D2D transmitter, and the second reference clock signal is the same as the first reference clock signal.

Clause 23. The semiconductor die according to Clause 21 or 22, wherein the first D2D transmitter is further configured to provide the first reference clock signal to the second D2D receiver.

Clause 24. The semiconductor die according to Clause 22, further including:

a third D2D transceiver, including:

a third D2D transmitter, configured to send data to a fourth D2D receiver in a fourth D2D transceiver of the another semiconductor die using the first reference clock signal; and a third D2D receiver, configured to receive data from a fourth D2D transmitter in the fourth D2D transceiver using the second reference clock signal.

Clause 25. The semiconductor die according to Clause 24, wherein the first phase locked loop is further configured to provide the first reference clock signal to the third D2D transmitter, wherein the third D2D receiver is configured to receive the second reference clock signal from the third D2D transmitter or the fourth D2D transmitter in the fourth D2D transceiver.

Clause 26. The semiconductor die according to Clause 21, wherein the first D2D transmitter is configured to receive the first reference clock signal from outside the semiconductor die, and to send the first reference clock signal to the second D2D receiver; and the first D2D receiver is configured to receive the second reference clock signal from the second D2D transmitter.

Clause 27. The semiconductor die according to Clause 26, further including:

a third D2D transceiver, including:

a third D2D transmitter, configured to receive the first reference clock signal from outside the semiconductor die and to send data and the first reference clock signal to a fourth D2D receiver in a fourth D2D transceiver of the another semiconductor die using the first reference clock signal; and a third D2D receiver, configured to receive the second clock signal from a fourth D2D transmitter in the fourth D2D transceiver and to receive data from the fourth D2D transmitter in the fourth D2D transceiver using the second reference clock signal.

Clause 28. An electronic component, including:

a circuit board; and the semiconductor die according to any one of Clauses 16 to 27, disposed on the circuit board.

Clause 29. An electronic apparatus, including: the electronic component according to Clause 28.

In addition, even in the case where a specific numerical example is described, in addition to being theoretically obviously limited to the numerical value, the same may be a numerical value exceeding the specific numerical value or may be a numerical value less than the specific numerical value. In addition, it is to be understood that the terms used herein in general, and particularly in the appended claims (for example, the body of the appended claims) are generally intended to be "open-ended" terms (for example, the term "including" should be interpreted as "including but not limited to", the term "having" should be interpreted as "having at least", etc.).

What is claimed is:

1. A semiconductor die, comprising:
   a first die to die (D2D) transceiver, comprising:
   a first D2D transmitter, configured to send data to a second D2D receiver in a second D2D transceiver of another semiconductor die using a first reference clock signal; and
   a first D2D receiver, configured to receive data from a second D2D transmitter in the second D2D transceiver using a second reference clock signal,
   a P2P link, configured to establish a communication channel with an external electronic device to transmit the data, the P2P link comprising:
   a first P2P sub-link, configured to establish a first communication channel with the external electronic device to transmit the data using a fourth reference clock signal from outside the semiconductor die or a second phase locked loop.

2. The semiconductor die according to claim 1, wherein the first D2D transmitter is further configured to provide the first reference clock signal to the second D2D receiver.

3. The semiconductor die according to claim 1, further comprising:
   a first phase locked loop, configured to receive an initial reference clock signal from outside the semiconductor die, and to provide the first reference clock signal to the first D2D transmitter,
   wherein the first D2D receiver is configured to receive the second reference clock signal from the first D2D transmitter or to receive the second reference clock signal from the second D2D transmitter, and the second reference clock signal is the same as the first reference clock signal.

4. The semiconductor die according to claim 3, further comprising:
   a third D2D transceiver, comprising:

a third D2D transmitter, configured to send data to a fourth D2D receiver in a fourth D2D transceiver of the another semiconductor die using the first reference clock signal; and a third D2D receiver, configured to receive data from a fourth D2D transmitter in the fourth D2D transceiver using the second reference clock signal.

5. The semiconductor die according to claim 4, wherein the first phase locked loop is further configured to provide the first reference clock signal to the third D2D transmitter, wherein the third D2D receiver is configured to receive the second reference clock signal from the third D2D transmitter or the fourth D2D transmitter in the fourth D2D transceiver.

6. The semiconductor die according to claim 1, wherein the first D2D transmitter is configured to receive the first reference clock signal from outside the semiconductor die, and to send the first reference clock signal to the second D2D receiver; and the first D2D receiver is configured to receive the second reference clock signal from the second D2D transmitter.

7. The semiconductor die according to claim 6, further comprising:

a third D2D transceiver, comprising:

a third D2D transmitter, configured to receive the first reference clock signal from outside the semiconductor die and to send data and the first reference clock signal to a fourth D2D receiver in a fourth D2D transceiver of the another semiconductor die using the first reference clock signal; and a third D2D receiver, configured to receive the second clock signal from a fourth D2D transmitter in the fourth D2D transceiver and to receive data from the fourth D2D transmitter in the fourth D2D transceiver using the second reference clock signal.

8. The semiconductor die according to claim 1, further comprising:

a host link, configured to communicate with a host to transmit the data, the host link comprising:

a first host sub-link, configured to transmit the data using a third reference clock signal;

a second host sub-link, configured to receive the third reference clock signal from the first host sub-link;

a third host sub-link, configured to receive the third reference clock signal from the first host sub-link; and a fourth host sub-link, configured to receive the third reference clock signal from the third host sub-link.

9. The semiconductor die according to claim 8, wherein the first host sub-link is further configured to receive the first reference clock signal from the second phase locked loop or a point to point (P2P) link or to receive the first reference clock signal from outside the semiconductor die.

10. The semiconductor die according to claim 1, wherein the P2P link further comprises:

a second P2P sub-link, configured to establish a second communication channel with the external electronic device to transmit the data using the fourth reference clock signal received from the first P2P sub-link.

11. The semiconductor die according to claim 10, wherein the P2P link further comprises:

a third P2P sub-link, configured to establish a third communication channel with the external electronic device to transmit the data using the fourth reference clock signal received from the second P2P sub-link;

a fourth P2P sub-link, configured to establish a fourth communication channel with the external electronic device to transmit the data using the fourth reference clock signal received from the second P2P sub-link;

a fifth P2P sub-link, configured to establish a fifth communication channel with the external electronic device to transmit the data using the fourth reference clock signal received from the fourth P2P sub-link; and a sixth P2P sub-link, configured to establish a sixth communication channel with the external electronic device to transmit the data using the fourth reference clock signal received from the fourth P2P sub-link.

12. An electronic apparatus, comprising:

an electronic component, comprising:

a circuit board; and a semiconductor die, disposed on the circuit board, and comprising:

a first die to die (D2D) transceiver, comprising:

a first D2D transmitter, configured to send data to a second D2D receiver in a second D2D transceiver of another semiconductor die using a first reference clock signal; and a first D2D receiver, configured to receive data from a second D2D transmitter in the second D2D transceiver using a second reference clock signal, a P2P link, configured to establish a communication channel with an external electronic device to transmit the data, the P2P link comprising:

a first P2P sub-link, configured to establish a first communication channel with the external electronic device to transmit the data using a fourth reference clock signal from outside the semiconductor die or the second phase locked loop.

13. A method for manufacturing a semiconductor die, comprising:

providing a first die to die (D2D) transceiver, comprising:

a first D2D transmitter, configured to send data to a second D2D receiver in a second D2D transceiver of another semiconductor die using a first reference clock signal; and a first D2D receiver, configured to receive data from a second D2D transmitter in the second D2D transceiver using a second reference clock signal, a P2P link, configured to establish a communication channel with an external electronic device to transmit the data, the P2P link comprising:

a first P2P sub-link, configured to establish a first communication channel with the external electronic device to transmit the data using a fourth reference clock signal from outside the semiconductor die or the second phase locked loop.

* * * * *